(12) United States Patent
Kumar et al.

(10) Patent No.: US 8,567,053 B2
(45) Date of Patent: Oct. 29, 2013

(54) METHODS OF MANUFACTURING PRINTED CIRCUIT BOARDS

(75) Inventors: Rajesh Kumar, Mission Viejo, CA (US); Monte P. Dreyer, Rancho Santa Margarita, CA (US); Michael J. Taylor, Longmont, CO (US)

(73) Assignee: DDi Global Corp., Anaheim, CA (US)

( * ) Notice: Subject to any disclaimer, the term of this patent is extended or adjusted under 35 U.S.C. 154(b) by 248 days.

(21) Appl. No.: 13/153,254

(22) Filed: Jun. 3, 2011

(65) Prior Publication Data
US 2012/0003844 A1    Jan. 5, 2012

Related U.S. Application Data

(60) Provisional application No. 61/351,253, filed on Jun. 3, 2010.

(51) Int. Cl.
*H01K 3/10* (2006.01)
(52) U.S. Cl.
USPC .................. 29/852; 29/829; 29/830; 29/841
(58) Field of Classification Search
USPC ........... 29/852, 825, 829, 830, 840, 841, 846
See application file for complete search history.

(56) References Cited

U.S. PATENT DOCUMENTS

| | | | | |
|---|---|---|---|---|
| 7,122,746 | B2 * | 10/2006 | Higuchi et al. | 174/262 |
| 7,721,427 | B2 * | 5/2010 | Enomoto et al. | 29/852 |
| 2001/0029065 | A1 | 10/2001 | Fischer et al. | |
| 2007/0246254 | A1 | 10/2007 | Kumar et al. | |
| 2008/0079120 | A1 | 4/2008 | Foster et al. | |
| 2008/0251495 | A1 | 10/2008 | Cheng et al. | |

OTHER PUBLICATIONS

Search Report for corresponding International Patent Application No. PCT/US2011/039171, mailed Sep. 27, 2011, 2 pages.
Written Opinion for corresponding International Patent Application No. PCT/US2011/039171, mailed Sep. 27, 2011, 6 pages.

* cited by examiner

*Primary Examiner* — Thiem Phan
(74) *Attorney, Agent, or Firm* — Polsinelli PC

(57) ABSTRACT

Systems and methods of manufacturing printed circuit boards using blind and internal micro vias to couple subassemblies. An embodiment of the invention provides a method of manufacturing a printed circuit including attaching a plurality of metal layer carriers to form a first subassembly including at least one copper foil pad on a first surface, applying an encapsulation material onto the first surface of the first subassembly, curing the encapsulation material and the first subassembly; applying a lamination adhesive to a surface of the cured encapsulation material, forming at least one via in the lamination adhesive and the cured encapsulation material to expose the at least one copper foil pad, attaching a plurality of metal layer carriers to form a second subassembly, and attaching the first subassembly and the second subassembly.

16 Claims, 8 Drawing Sheets

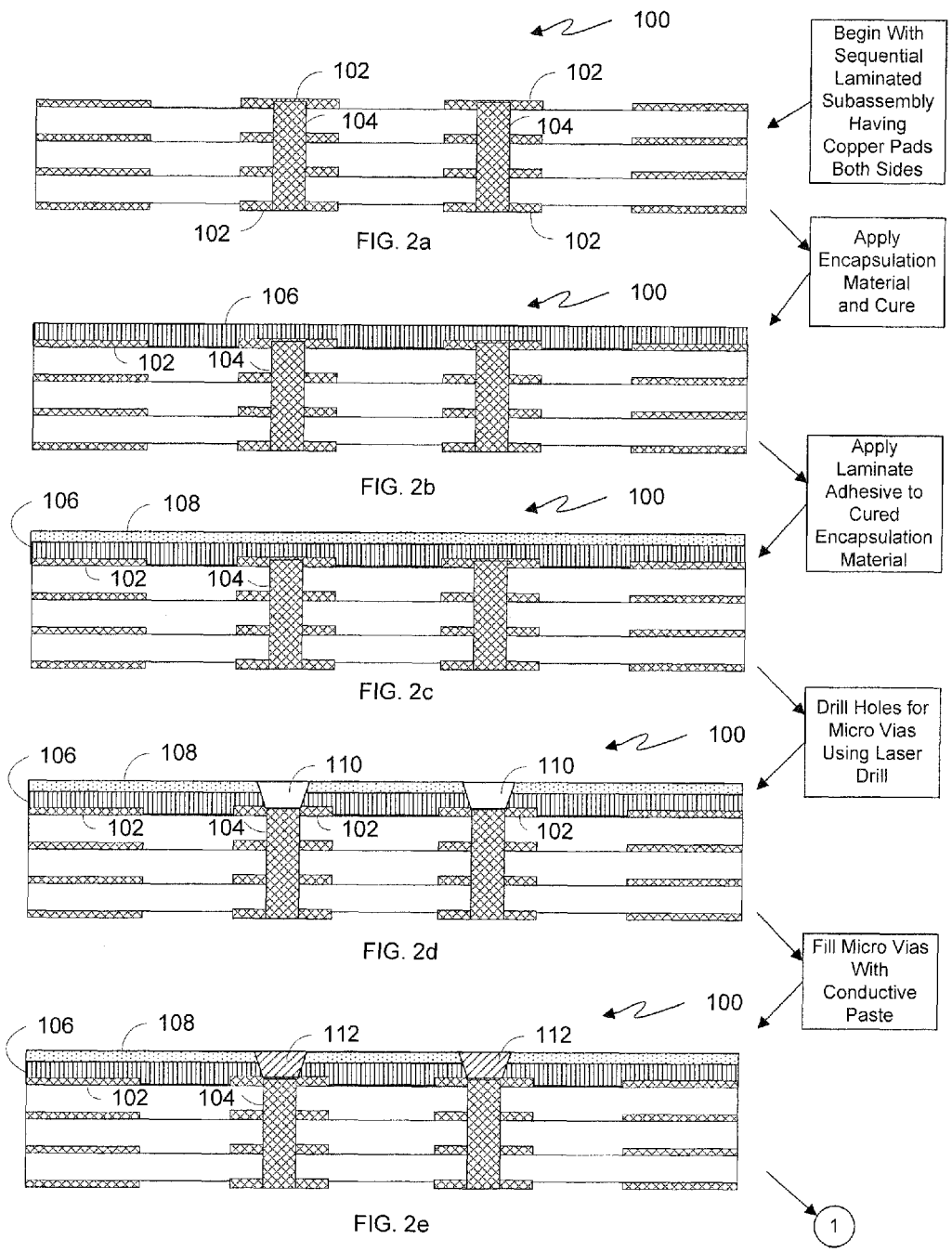

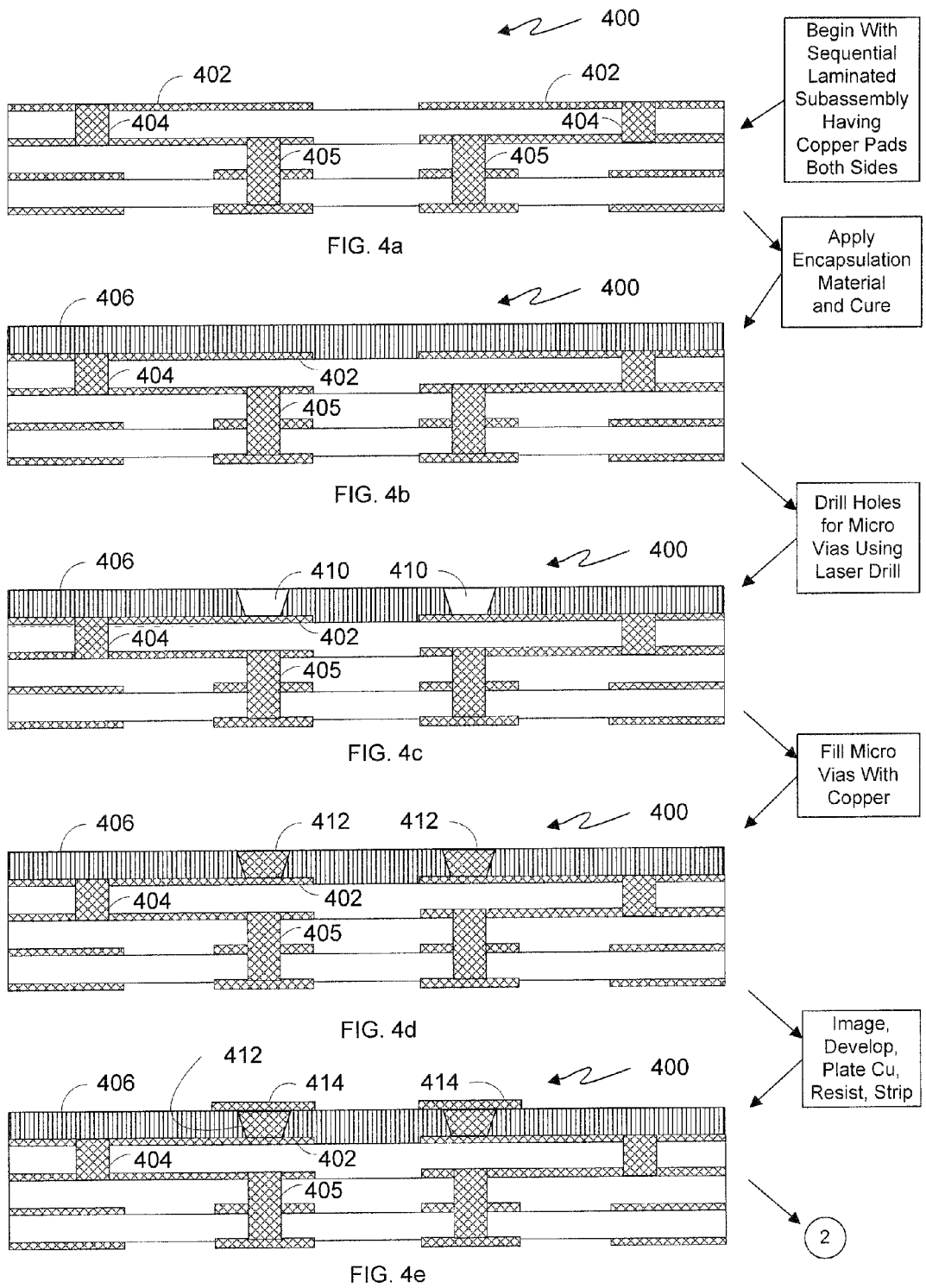

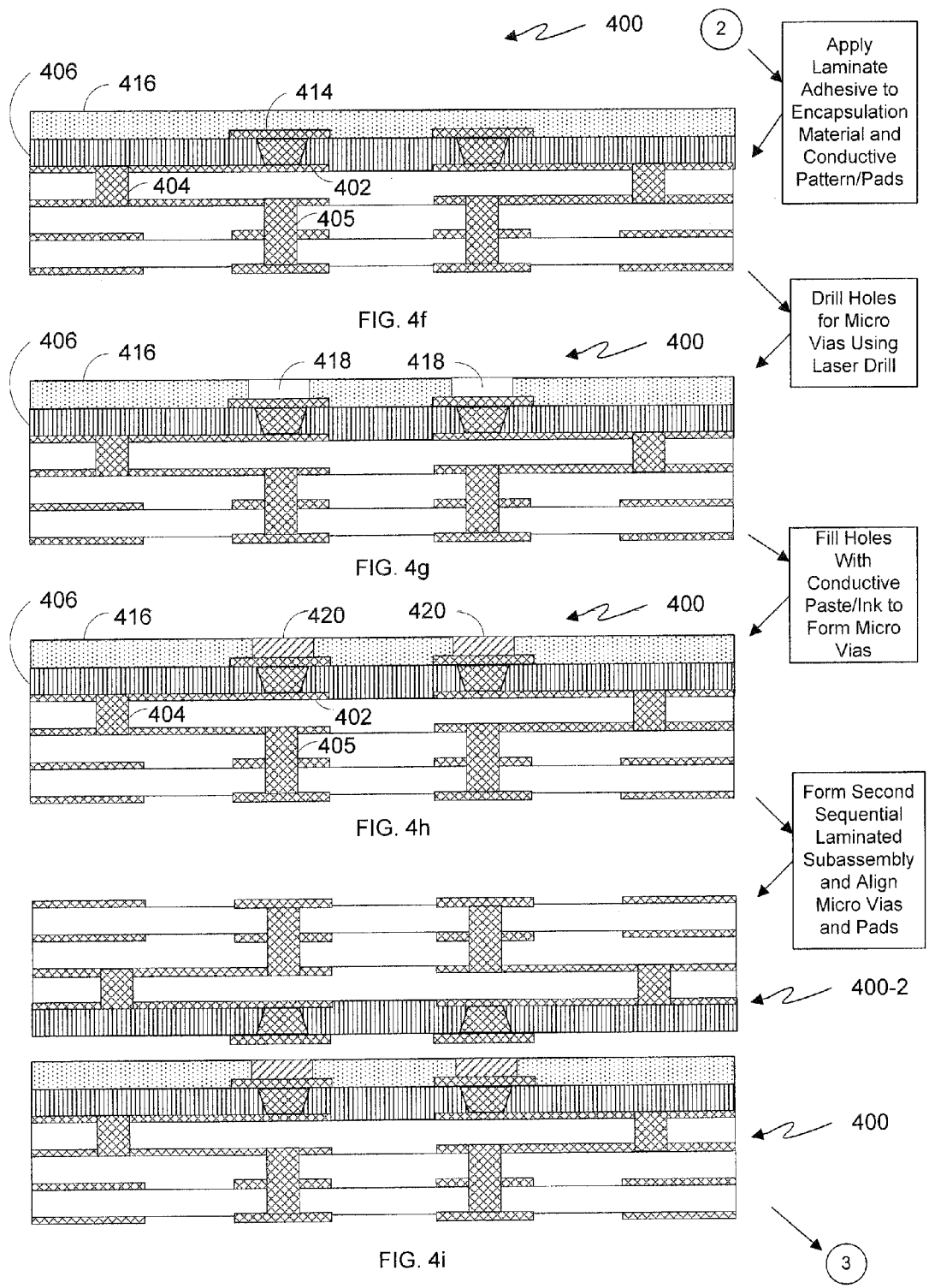

METHODS OF MANUFACTURING PRINTED CIRCUIT BOARDS

The present application claims priority to and the benefit of Provisional Application No. 61/351,253, filed Jun. 3, 2010, entitled "METHODS OF MANUFACTURING PRINTED CIRCUIT BOARDS USING INTERNAL STACKED MICRO VIAS TO COUPLE SUBASSEMBLIES", the entire content of which is incorporated herein by reference.

FIELD OF THE INVENTION

The present invention relates generally to printed circuit boards and methods of manufacturing the same, and more particularly, to printed circuit boards having circuit layers laminated with blind and internal micro via(s) and methods of manufacturing the same.

BACKGROUND

Most electronic systems include printed circuit boards with high density electronic interconnections. A printed circuit board (PCB) may include one or more circuit cores, substrates, or carriers. In one fabrication scheme for the printed circuit board having the one or more circuit carriers, electronic circuitries (e.g., pads, electronic interconnects, etc.) are fabricated onto opposite sides of an individual circuit carrier to form a pair of circuit layers. These circuit layer pairs of the circuit board may then be physically and electronically joined to form the printed circuit board by fabricating an adhesive (or a prepreg or a bond ply), stacking the circuit layer pairs and the adhesives in a press, curing the resulting circuit board structure, drilling through-holes, and then plating the through-holes with a copper material to interconnect the circuit layer pairs.

The curing process is used to cure the adhesives to provide for permanent physical bonding of the circuit board structure. However, the adhesives generally shrink significantly during the curing process. The shrinkage combined with the later through-hole drilling and plating processes can cause considerable stress into the overall structure, leading to damage or unreliable interconnection or bonding between the circuit layers. Thus, there is a need for material and associated processes which can compensate for this shrinkage and can provide for a more stress-free and reliable electronic interconnection between the circuit layer pairs.

In addition, the plating of the through-holes (or vias) with the copper material requires an additional, expensive, and time consuming process sequence that is difficult to implement with a quick turnaround. FIG. 1 is a flowchart of a sequential lamination process for manufacturing a printed circuit board having stacked vias including expensive and time consuming sequential lamination and plating steps. Thus, there is a need to provide for a printed circuit board and a method of manufacturing the same that can be quickly and easily fabricated and/or ensure alignment of the interconnections (or through-holes or micro vias) on the printed circuit board by reducing iterations of key processes to thereby reduce manufacturing time and cost.

SUMMARY

Aspects of embodiments of the invention relate and are directed to systems and methods of manufacturing printed circuit boards using blind and internal micro vias to couple subassemblies. An embodiment of the invention provides a method of manufacturing a printed circuit including attaching a plurality of metal layer carriers to form a first subassembly including at least one copper foil pad on a first surface, applying an encapsulation material onto the first surface of the first subassembly, curing the encapsulation material and the first subassembly; applying a lamination adhesive to a surface of the cured encapsulation material, forming at least one via in the lamination adhesive and the cured encapsulation material to expose the at least one copper foil pad, attaching a plurality of metal layer carriers to form a second subassembly, and attaching the first subassembly and the second subassembly.

Another embodiment of the invention provides a method of manufacturing a multi-layer printed circuit board including forming a first subassembly including (a) attaching at least one metal layer carrier to form a first subassembly including at least one copper foil pad on a first surface, (b) applying an encapsulation material onto the first surface of the first subassembly, (c) curing the encapsulation material and the first subassembly, (d) forming at least one first via in the cured encapsulation material to expose the at least one copper foil pad, (e) forming a conductive pattern on a surface of the cured encapsulation material, the conductive pattern including a conductive pad coupled to the at least one first via, (f) applying a lamination adhesive to the surface of the cured encapsulation material, (g) forming at least one hole in the lamination adhesive proximate the at least one first via, (h) filling the at least one hole with a conductive material to form at least one second via, repeating (a) through (e) to form a second subassembly, attaching the first subassembly and the second subassembly such that the at least one second via of the first subassembly is about aligned with the conductive pad of the second subassembly.

Yet another embodiment of the invention provides an attachment structure for coupling subassemblies of a multi-layer printed circuit board, the structure including a first assembly including a first metal layer carrier including a first blind via including a first capture pad positioned in a top surface of the first metal layer carrier, a first laminate adhesive layer positioned along the top surface and the first capture pad, and a first via about filled with a conductive material positioned in the first laminate adhesive, the first via in contact with the first capture pad, and a second assembly including a second metal layer carrier including a second blind via including a second capture pad positioned in a top surface of the second metal layer carrier, where the first assembly is attached to the second assembly using the first laminate adhesive layer such that the first via in the first adhesive is about aligned with the second capture pad of the second blind via.

BRIEF DESCRIPTION OF THE DRAWINGS

FIGS. 2a-2f illustrate a process for attaching subassemblies to form a multi-layer printed circuit board using internal micro vias positioned in encapsulation and adhesive layers in accordance with one embodiment of the present invention.

FIGS. 4a-4j illustrate an alternative process for attaching subassemblies to form a multi-layer printed circuit board using internal micro vias positioned in an adhesive layer in accordance with one embodiment of the present invention.

DETAILED DESCRIPTION

Figure 1:
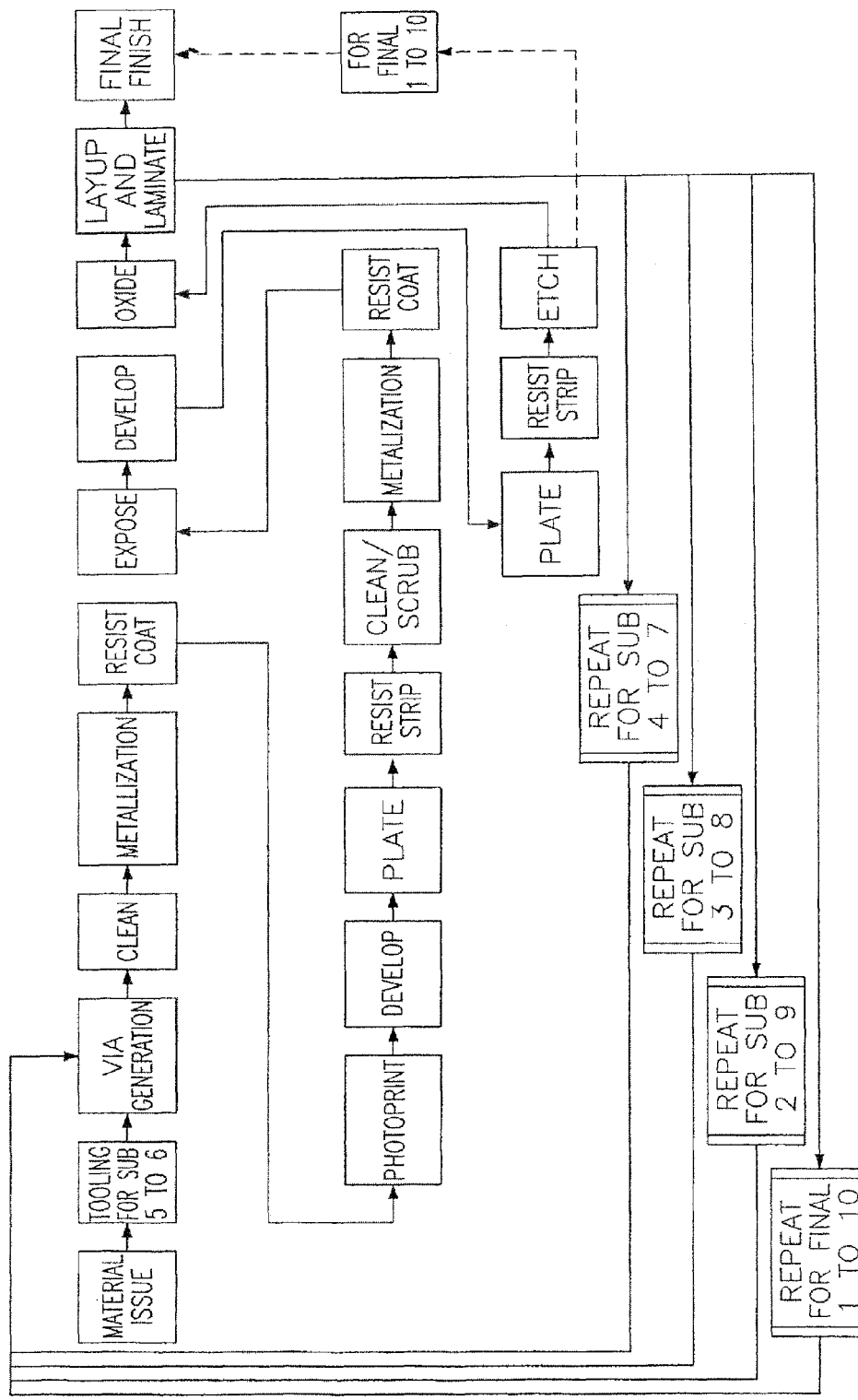
FIG. 1 is a flowchart of a sequential lamination process for manufacturing a printed circuit board having stacked vias including sequential lamination and plating steps.

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive. There may be parts shown in the drawings, or parts not shown in the drawings, that are not discussed in the specification as they are not essential to a complete understanding of the invention. Like reference numerals designate like elements.

FIG. 1 is a flowchart of a sequential lamination process for manufacturing a printed circuit board having stacked vias including sequential lamination and plating steps.

FIGS. 2a-2f show a process for manufacturing a printed circuit board including attaching laminated subassemblies using internal micro vias positioned in encapsulation and adhesive layers in accordance with one embodiment of the present invention.

In FIG. 2a, the process begins when a laminated subassembly 100 having four layers and copper pads (e.g., foil) 102 on both sides is provided. The laminated subassembly 100 further includes two plated or filled through hole vias 104. The layers of the subassembly can be made of metal, ceramic, or insulating material (e.g., FR4, LCP, Thermount, BT, GPY, such as Teflon, thermally conducting carbon (stablecor), halogen free, etc., where GPY is a laminate that does not fit in the FR4 category, such as polyimide, aziridine cured epoxy, bismalimide, and other electrical grades of laminate). The present invention, however, is not thereby limited. In other embodiments, other suitable substrate and conductive layer materials can be used. In the embodiment shown in FIG. 2a, the subassembly layers have a thickness ranging from about 3 to 4 mils. However, in other embodiments, the subassembly layers and other components can have other suitable dimensions.

In several embodiments, the laminated subassembly 100 can be manufactured using the process described in FIG. 1. In other embodiments, the subassembly can be a single lamination subassembly having multiple single metal layer carriers and stacked micro vias. Aspects of single lamination processes for manufacturing circuit boards are further described in U.S. Pat. No. 7,523,545, U.S. Prov. Pat. Appl. No. 61/189,171, and U.S. patent application Ser. No. 12/772,086 the entire content of each of which is incorporated herein by reference.

In the embodiment illustrated in FIG. 2a, the laminated subassembly 100 includes four metal layers. In other embodiments, the laminated subassembly can include more than or less than three metal layer carriers. In the embodiment illustrated in FIG. 2a, the laminated subassembly includes two through hole vias. In other embodiments, the laminated subassembly can have more then or less than two vias. In other embodiments, the through hole vias can be replaced with stacked micro vias, buried vias, and/or blind vias.

In FIG. 2b, the process applies an encapsulation material 106 to a top surface of the laminated subassembly 100 and cures it. In several embodiments, the encapsulation material is a dielectric material. In several embodiments, the curing is achieved by heating the subassembly and encapsulation material thereon at a pre-selected temperature for a pre-selected duration.

The encapsulation material can be any suitable non-cured insulating material, including, without limitation, FR4, LCP, Thermount, BT, GPY, such as Teflon, thermally conducting carbon (stablecor), halogen free, etc., where GPY is a laminate that does not fit in the FR4 category, such as polyimide, aziridine cured epoxy, bismalimide, and other electrical grades of laminate.

In FIG. 2c, the process applies a laminate adhesive 108 to a top surface of the cured encapsulation material 106.

In FIG. 2d, the process forms holes 110 for micro vias by drilling through the laminate adhesive 108 and encapsulation material 106 up to a top surface of the copper pads 102. Each of the micro vias can be formed by laser drilling (and/or mechanical drilling) holes with a diameter ranging from about 4 to 10 mils. In other embodiments, other suitable techniques for forming via holes can be used. In addition, other via sizes can be used.

In FIG. 2e, the holes 110 are filled with conductive paste thereby forming micro vias 112. In some embodiments, the micro vias are filled with copper instead of conductive paste. In one embodiment, conductive paste is used when the via holes are laser drilled and copper is used when the holes are mechanically drilled.

Figure 2F:
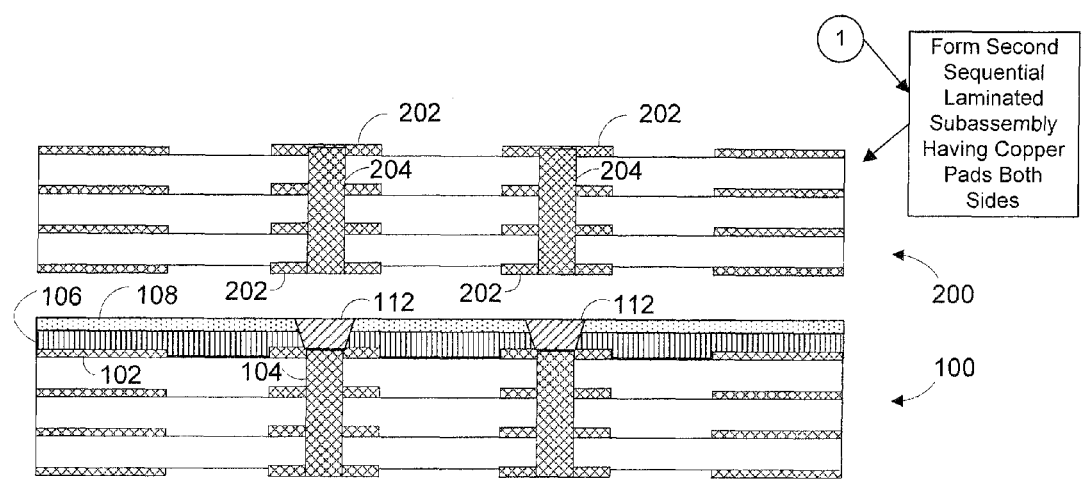

In FIG. 2f, a second laminated subassembly 200 having copper pads 202 on both sides is provided and brought in proximity to the first laminated subassembly 100.

Figure 2G:
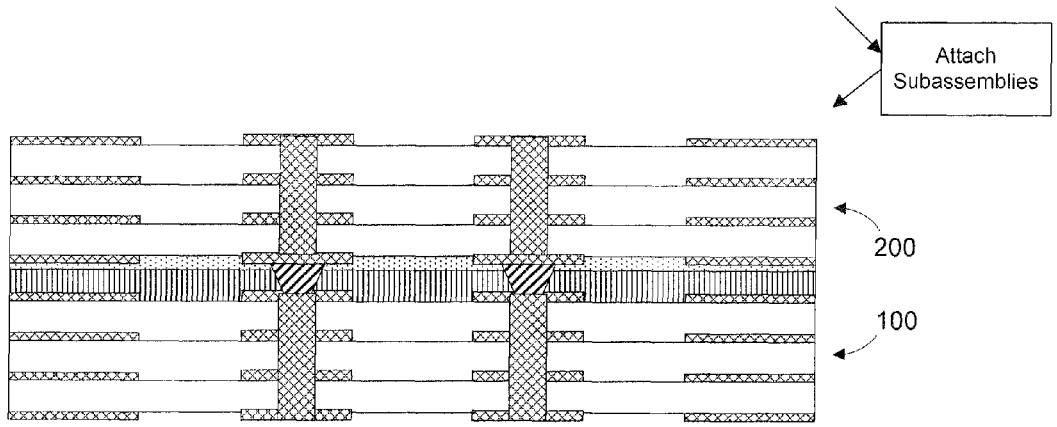
FIG. 2g is a cross sectional view of the finalized multi-layer printed circuit board of FIGS. 2a-2f in accordance with one embodiment of the present invention.

FIG. 2g is a cross sectional view of the finalized multi-layer printed circuit board of FIGS. 2a-2f in accordance with one embodiment of the present invention. In FIG. 2g, the first and second subassemblies (100, 200) are brought together and attached. In some applications it can be difficult to connect and manufacture boards having high aspect ratio vias. By attaching the laminated subassemblies using the process described above, the method of attachment and manufacturing is made much easier. In the embodiment illustrated in FIG. 2g, the process of FIGS. 2b-2e is performed on the top surface of the first laminated subassembly 100. In other embodiments, the process of FIGS. 2b-2e is performed on both the top and bottom surfaces of the laminated subassembly 100 to allow for attachment of more than one second subassembly 200 to the first subassembly 100.

Figure 3:
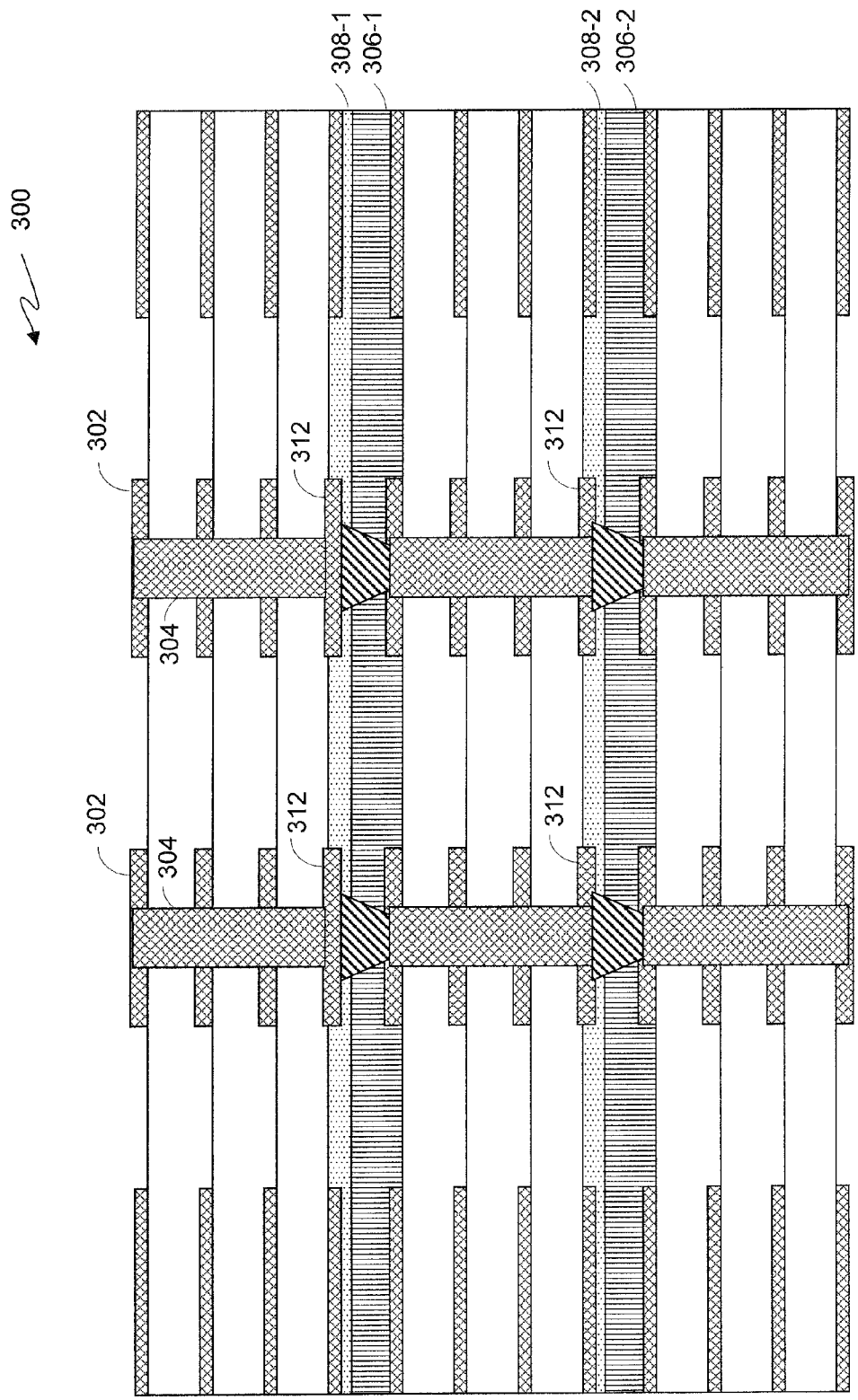
FIG. 3 is a cross sectional view of a multi-layer printed circuit board having three subassemblies attached using the process of FIGS. 2a-2f in accordance with one embodiment of the present invention.

FIG. 3 is a cross sectional view of a multi-layer printed circuit board 300 including three subassemblies attached using the process of FIGS. 2a-2f in accordance with one embodiment of the present invention. In other embodiments, more than three subassemblies can be attached using the processes of FIGS. 2a-2f. The PCB 300 includes three subassemblies having multiple copper pads 302 and through hole vias 304. The subassemblies are attached by internal micro vias 312 embedded in the encapsulation layers (306-1, 306-2) and adhesive layers (308-1, 308-2). In the embodiment illustrated in FIG. 3, the subassembly to subassembly attachment is implemented using a micro via filled with a conductive paste. In other embodiments, the subassembly to subassembly attachment can be implemented using a solid copper plated micro via or solid copper through hole via.

FIGS. 4a-4j illustrate an alternative process for attaching subassemblies to form a multi-layer printed circuit board using internal micro vias in accordance with one embodiment of the present invention.

In FIG. 4a, the process begins when a laminated subassembly 400 having four layers and copper pads (e.g., foil) 402 on both sides is provided. The laminated subassembly 400 further includes two plated or filled blind vias 404 coupled to another two plated or filled blind vias 405. The layers of the subassembly can be made of metal, ceramic, or insulating material (e.g., FR4, LCP, Thermount, BT, GPY, such as Teflon, thermally conducting carbon (stablecor), halogen free, etc., where GPY is a laminate that does not fit in the FR4 category, such as polyimide, aziridine cured epoxy, bismalimide, and other electrical grades of laminate). The present invention, however, is not thereby limited. In other embodiments, other suitable substrate and conductive layer materials can be used. In the embodiment shown in FIG. 4a, the subassembly layers have a thickness ranging from about 3 to 4 mils. However, in other embodiments, the subassembly layers and other components can have other suitable dimensions.

In several embodiments, the laminated subassembly 400 can be manufactured using the process described in FIG. 1. In other embodiments, the subassembly can be a single lamination subassembly having multiple single metal layer carriers and stacked micro vias. Aspects of single lamination processes for manufacturing circuit boards are further described in the above referenced patents and patent applications.

In the embodiment illustrated in FIG. 4a, the laminated subassembly 400 includes four metal layers. In other embodiments, the laminated subassembly can include more than or less than three metal layer carriers. In the embodiment illustrated in FIG. 4a, the laminated subassembly includes four blind vias. In other embodiments, the laminated subassembly can have more then or less than four vias. In other embodiments, the blind vias can be replaced with through hole, buried vias, and/or stacked vias.

In FIG. 4b, the process applies an encapsulation material 406 to a top surface of the laminated subassembly 400 and cures it. In several embodiments, the encapsulation material is a dielectric material. In several embodiments, the curing is achieved by heating the subassembly and encapsulation material thereon at a pre-selected temperature for a pre-selected duration.

The encapsulation material can be any suitable non-cured insulating material, including, without limitation, FR4, LCP, Thermount, BT, GPY, such as Teflon, thermally conducting carbon (stablecor), halogen free, etc., where GPY is a laminate that does not fit in the FR4 category, such as polyimide, aziridine cured epoxy, bismalimide, and other electrical grades of laminate.

In FIG. 4c, the process forms holes 410 for micro vias (or vias) by drilling through the encapsulation material 406 up to a top surface of the copper pads 402. Each of the micro vias can be formed by laser drilling (and/or mechanical drilling) holes with a diameter ranging from about 4 to 10 mils. In other embodiments, other suitable techniques for forming via holes can be used. In addition, other via sizes can be used.

In FIG. 4d, the holes 410 are filled with copper thereby forming solid copper micro vias 412. In some embodiments, the micro vias 412 are filled with conductive paste instead of copper. In one embodiment, conductive paste is used when the via holes are laser drilled and copper is used when the holes are mechanically drilled.

In FIG. 4e, the process images, develops, plates copper, adds resist and strips the resist to form a conductive pattern on the encapsulation layer 406 and on vias 412. The conductive pattern includes capture pads 414 positioned on top of vias 412.

In FIG. 4f, the process applies a laminate adhesive 416 to a top surface of the cured encapsulation material 406 and the capture pads 414.

In FIG. 4g, the process forms holes 418 for thin micro vias by drilling through the laminate adhesive 416 up to a top surface of the capture pads 414. Each of the thin micro vias can be formed by laser drilling (and/or mechanical drilling) holes with a diameter ranging from about 1 to 3 mils. In other embodiments, other suitable techniques for forming via holes can be used. In addition, other via sizes can be used.

In FIG. 4h, the holes 418 are filled with conductive paste thereby forming micro vias 420.

In FIG. 4i, a second laminated subassembly 400-2 having substantially similar features on one surface thereof to the first subassembly 400 of FIG. 4e, including two blind solid copper micro vias with conductive pads positioned thereon, is formed and aligned such that the thin conductive paste filled micro vias of the first laminated assembly 400 and corresponding conductive pads of the second laminated assembly 400-2 will be physically and electrically coupled when they are brought together for attachment, and secured by the laminate adhesive 416.

Figure 4J:
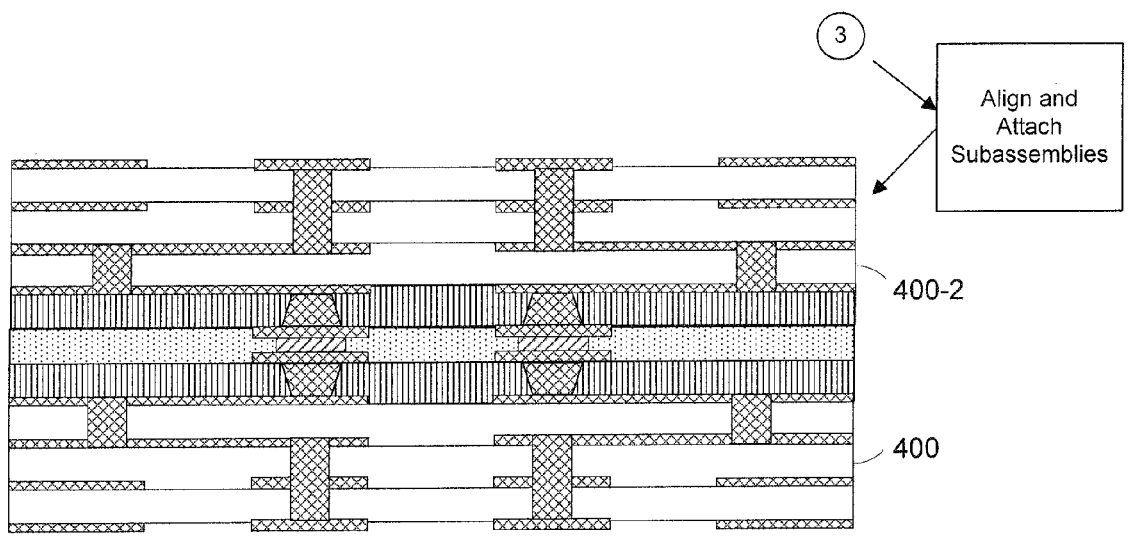

FIG. 4j is a cross sectional view of the finalized multi-layer printed circuit board of FIGS. 4a-4i in accordance with one embodiment of the present invention. In FIG. 4j, the first and second subassemblies (400, 400-2) are brought together and attached. In some applications it can be difficult to connect and manufacture boards having high aspect ratio vias. In some applications, complex via structures can be too difficult to manufacture using traditional manufacturing methods. By attaching the laminated subassemblies using the process described above, the method of attachment and manufacturing is made much easier. In addition, the conductive paste or conductive ink micro via between the laminated subassemblies is very thin (e.g., 3 to 5 mils). While not bound by any particular theory, the thin micro via or joint can provide good high frequency conductivity. In several embodiments, the electrical conductivity of the joint is not as good as a highly conductive metal such as copper. However, because the joint is thin, it can provide the good conductivity for signals having high frequency characteristics (e.g., radio frequency type signals and the like). In addition, the thin copper paste joint can provide minimal disruption to the electrical current flowing therethrough.

In embodiments illustrated in FIGS. 4a-4j, the process is performed on the top surface of the first laminated subassembly 400. In other embodiments, the process of FIGS. 4a-4j is performed on both the top and bottom surfaces of the laminated subassembly 400 to allow for attachment of more than one second subassembly 400-2 to the first subassembly 400.

In several embodiments, the conductive paste or conductive ink can include a mixture of copper and tin. In other embodiments, other suitable conductive materials can be used for the conductive paste.

Figure 5:
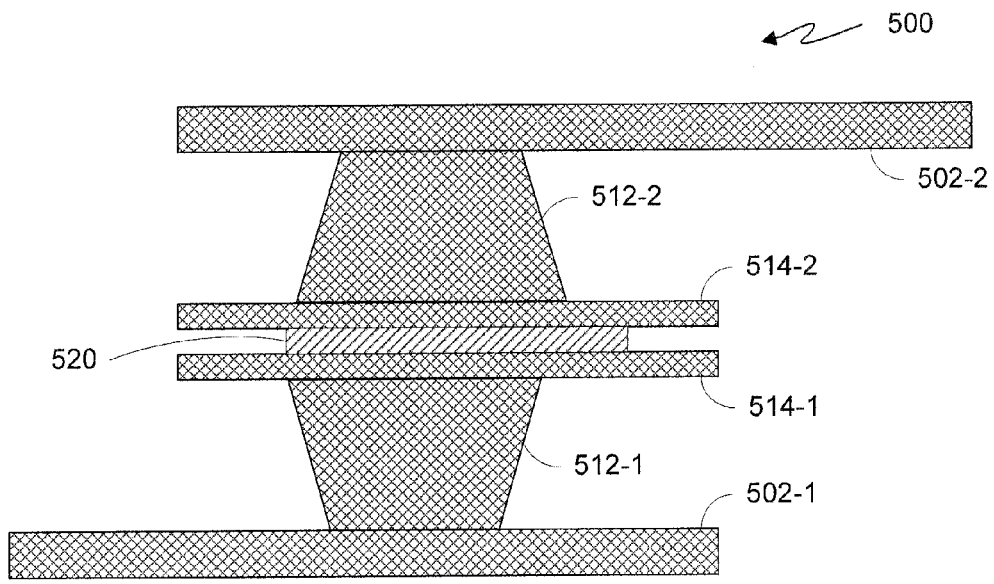
FIG. 5 is a cross sectional expanded view of a subassembly to subassembly attachment including two blind vias coupled by adhesive and conductive paste to form a thin via in accordance with the process of FIGS. 4a-4j.

FIG. 5 is a cross sectional expanded view of a subassembly to subassembly attachment 500 including two blind vias (512-1, 512-2) coupled by adhesive (not shown) and conductive paste 520 to form a thin via in accordance with the process of FIGS. 4a-4j. Each of the blind vias (512-1, 512-2) includes conductive pads (502-1, 502-2) on outer surfaces thereof and conductive pads (514-1, 514-2) on inner surfaces thereof. The conductive paste structure 520 forms a thin micro via within the adhesive (see FIG. 4j), which can have the desirable properties discussed above.

Figure 6:
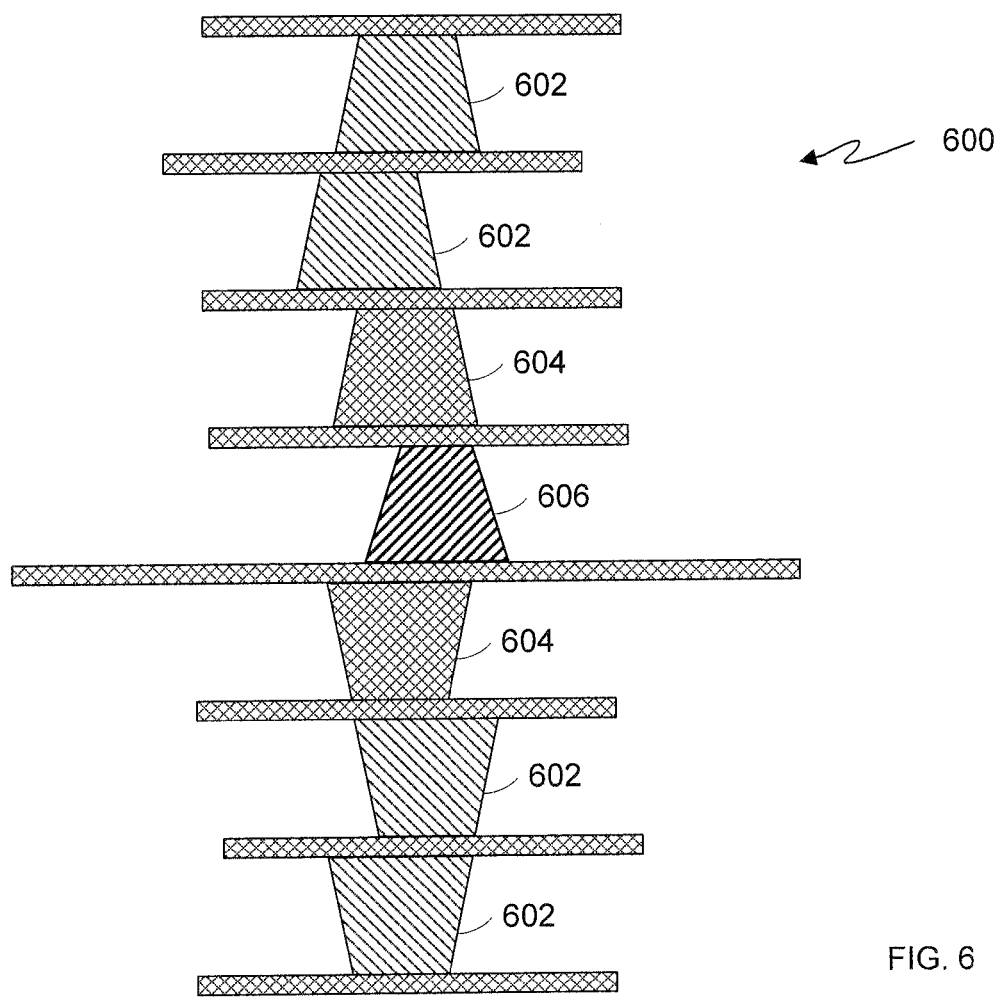
FIG. 6 is a cross sectional expanded view of another subassembly to subassembly attachment including stacked vias on each subassembly coupled by adhesive and conductive paste to form a via in accordance with one embodiment of the present invention.

FIG. 6 is a cross sectional expanded view of another subassembly to subassembly attachment 600 including stacked vias (602, 604) on each subassembly coupled by adhesive (not shown) and a conductive paste via 606 in accordance with one embodiment of the present invention. As compared to the subassembly attachment of FIG. 5, the conductive paste via 606 is substantially taller (e.g., z-axis length). This taller form of the conductive paste via can be easier to manufacture and provides good control of the impedance between board layers.

Figure 7:
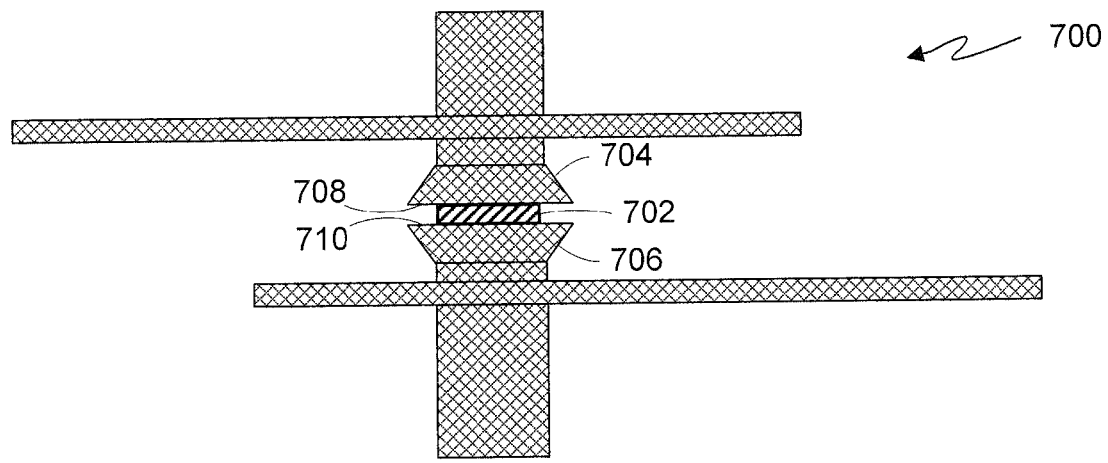
FIG. 7 is a cross sectional expanded view of another subassembly to subassembly attachment using a conductive paste micro via located between two mechanically drilled vias having enlarged surface areas in accordance with one embodiment of the present invention.

FIG. 7 is a cross sectional expanded view of another subassembly to subassembly attachment 700 using a conductive paste micro via 702 located between two mechanically drilled vias (704, 706) having enlarged surface areas (708, 710) in accordance with one embodiment of the present invention.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. For example, while certain components have been indicated to be formed of copper, other suitable conductive materials may be used instead of copper.

What is claimed is:

1. A method of manufacturing a printed circuit board comprising:
    attaching a plurality of metal layer carriers to form a first subassembly comprising at least one copper foil pad on a first surface;
    applying an encapsulation material onto the first surface of the first subassembly;
    curing the encapsulation material and the first subassembly;
    applying a lamination adhesive to a surface of the cured encapsulation material;
    forming at least one via in the lamination adhesive and the cured encapsulation material to expose the at least one copper foil pad;
    attaching a plurality of metal layer carriers to form a second subassembly; and
    attaching the first subassembly and the second subassembly.

2. The method of claim 1, further comprising:
    attaching a plurality of metal layer carriers to form a third subassembly comprising at least one copper foil pad on a first surface;
    applying a second encapsulation material onto the first surface of the third subassembly;
    curing the second encapsulation material and the third subassembly;
    applying a second lamination adhesive to a surface of the cured second encapsulation material;
    forming at least one via in the second lamination adhesive and the second cured encapsulation material to expose the at least one copper foil pad of the third subassembly; and
    attaching the third subassembly and the first subassembly.

3. The method of claim 1, wherein the forming at least one via in the lamination adhesive and the cured encapsulation material to expose the at least one copper foil pad comprises:
    drilling at least one hole in the lamination adhesive and the cured encapsulation material;
    filling the at least one hole with a conductive paste.

4. The method of claim 3, wherein the conductive paste comprises a material comprising one or more metals.

5. The method of claim 3, wherein the conductive paste comprises a conductive ink.

6. The method of claim 1, wherein the attaching the first subassembly and the second subassembly comprises:
    aligning the at least one via with a pad on the second assembly;
    attaching the first subassembly and the second subassembly using the laminate adhesive,
    wherein the via and the pad are electrically coupled.

7. The method of claim 1, wherein the via is a micro via.

8. A method of manufacturing a multi-layer printed circuit board comprising:
    forming a first subassembly comprising:
        (a) attaching at least one metal layer carrier to form a first subassembly comprising at least one copper foil pad on a first surface;
        (b) applying an encapsulation material onto the first surface of the first subassembly;
        (c) curing the encapsulation material and the first subassembly;
        (d) forming at least one first via in the cured encapsulation material to expose the at least one copper foil pad;
        (e) forming a conductive pattern on a surface of the cured encapsulation material, the conductive pattern including a conductive pad coupled to the at least one first via;
        (f) applying a lamination adhesive to the surface of the cured encapsulation material;
        (g) forming at least one hole in the lamination adhesive proximate the at least one first via;
        (h) filling the at least one hole with a conductive material to form at least one second via;
    repeating (a) through (e) to form a second subassembly;
    attaching the first subassembly and the second subassembly such that the at least one second via of the first subassembly is about aligned with the conductive pad of the second subassembly.

9. The method of claim 8, wherein the at least one first via of the first subassembly is a blind via, and wherein the at least one first via of the second subassembly is a blind via.

10. The method of claim 8, wherein the at least one first via of the first subassembly is electrically coupled with the at least one first via of the second subassembly.

11. The method of claim 8, wherein the at least one first via is about filled with copper.

12. The method of claim 8, wherein the forming the at least one first via in the cured encapsulation material to expose the at least one copper foil pad comprises:
    drilling at least one first hole in the cured encapsulation material; and
    filling the at least one first hole with copper.

13. The method of claim 8, wherein the forming the conductive pattern on the surface of the cured encapsulation material comprises forming a conductive pad on at least a portion of the first via.

14. The method of claim 8, wherein the conductive material comprises one or more metals.

15. The structure of claim 14, wherein the conductive material comprises a material selected from the group comprising copper and tin.

16. The method of claim 8, wherein the conductive material comprises a conductive ink.

* * * * *